(12) United States Patent
Wu et al.

(10) Patent No.: US 7,223,624 B2
(45) Date of Patent: May 29, 2007

(54) MICROMECHANICAL DEVICE WITH THINNED CANTILEVER STRUCTURE AND RELATED METHODS

(75) Inventors: Guanghua Wu, Dublin, CA (US); Amir Raza Mirza, Goleta, CA (US)

(73) Assignee: General Electric Company, Fremont, CA (US)

( * ) Notice: Subject to any disclaimer, the term of this patent is extended or adjusted under 35 U.S.C. 154(b) by 0 days.

(21) Appl. No.: 11/322,852

(22) Filed: Dec. 30, 2005

(65) Prior Publication Data

US 2006/0101912 A1    May 18, 2006

Related U.S. Application Data

(62) Division of application No. 10/774,011, filed on Feb. 6, 2004, now abandoned.

(51) Int. Cl.
*H01L 21/02* (2006.01)
*G01P 15/12* (2006.01)
(52) U.S. Cl. .................. 438/52; 73/514.33; 73/514.36
(58) Field of Classification Search ............. 73/514.33, 73/514.36, 514.37, 514.16, 514.01, 714, 73/727; 438/50, 52
See application file for complete search history.

(56) References Cited

U.S. PATENT DOCUMENTS

| | | | | | |
|---|---|---|---|---|---|
| 4,882,933 | A | * | 11/1989 | Petersen et al. | 73/514.33 |
| 5,121,633 | A | * | 6/1992 | Murakami et al. | 73/514.16 |
| 5,279,162 | A | * | 1/1994 | Takebe et al. | 73/726 |
| 5,659,138 | A | * | 8/1997 | Iwata et al. | 73/514.33 |
| 6,084,257 | A | * | 7/2000 | Petersen et al. | 438/52 |
| 6,912,759 | B2 | * | 7/2005 | Izadnegahdar et al. | 438/53 |

OTHER PUBLICATIONS

Petersen et al. (1991), "Surface Micromachined Structures Fabricated with Silicon Fusion Bonding," IEEE, pp. 397-399.*

* cited by examiner

*Primary Examiner*—John E. Chapman

(74) *Attorney, Agent, or Firm*—Morrison & Foerster LLP

(57) ABSTRACT

In one aspect, a microelectromechanical device and method of producing the device includes an accelerometer with a thinned flexure structure. In another embodiment, the device and method of producing the device includes an accelerometer and a pressure sensor integrated on a single chip.

11 Claims, 14 Drawing Sheets

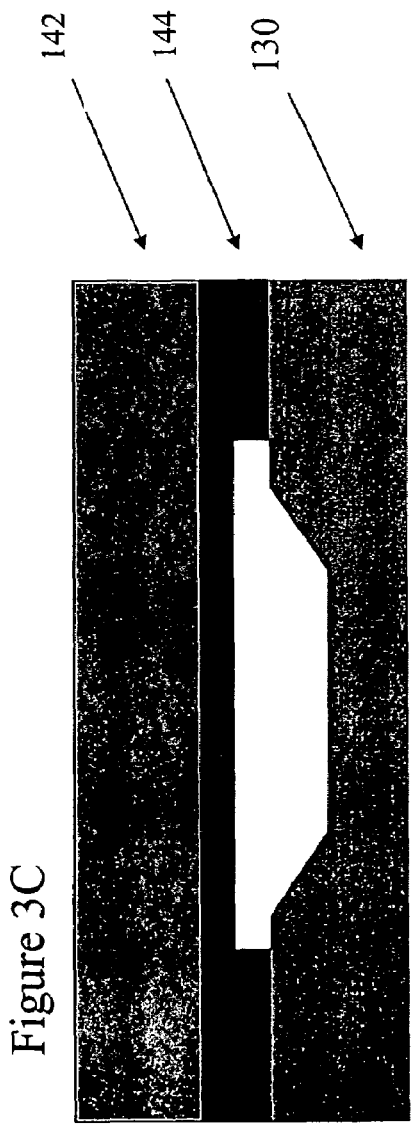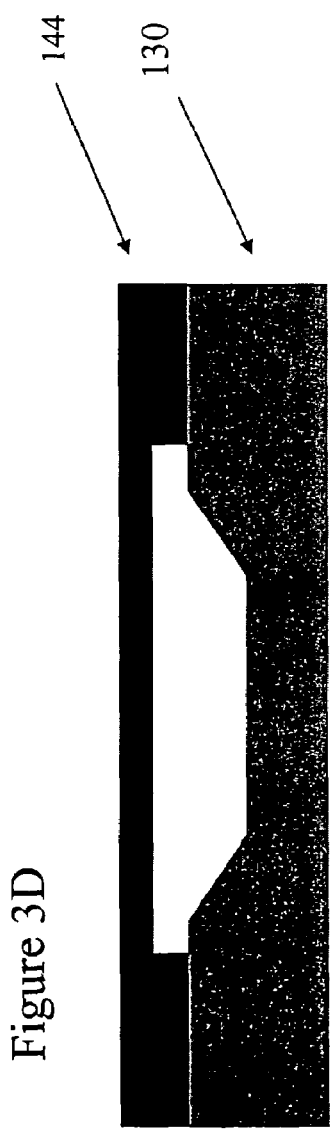
Figure 3C
Figure 3D

MICROMECHANICAL DEVICE WITH THINNED CANTILEVER STRUCTURE AND RELATED METHODS

CROSS-REFERENCE TO RELATED APPLICATION

This application is a Divisional of prior application U.S. Ser. No. 10/774,011, filed Feb. 6, 2004, the disclosure of which is herein incorporated by reference in its entirety.

BACKGROUND OF THE INVENTION

1. Field of the Invention

The invention relates generally to semiconductor microelectromechanical devices or micromechanical force sensors that can be used to detect small forces or flexures generated from chemo-mechanical stress, thermal stress, electromagnetic fields, and the like. More particularly, but not limited to, the invention relates to integrated piezoresistive accelerometers and pressure sensors that may be manufactured on a single chip.

2. Description of the Related Art

Advances in semiconductor microelectronic sensors have served to greatly reduce the size and cost of such sensors. The electrical and mechanical properties of silicon microsensors have been well chronicled. For example, refer to Kurt E. Petersen, "Silicon as a Mechanical Material," Proceedings of the IEEE, vol. 70, No. 5, May 1982. Moreover, there is a large and growing body of knowledge concerning techniques for constructing silicon microstructures, commonly referred to as "micromachining." See, for example, Bryzek, Petersen and McCulley, "Micromachines on the March," IEEE Spectrum, May 1994, pp. 20-31.

Thus, silicon micromachining and semiconductor microelectronic sensors have blossomed into a vital industry with numerous practical applications. For instance, micromachined silicon pressure sensors, acceleration sensors, flow sensor, and the like have found their way into various applications and industries ranging from medical instruments to automobiles. The high strength, elasticity, and resilience of silicon makes it an ideal base material for resonant structures that may, for example, be useful for electronic frequency control or sensor structures. Even consumer items such as watches, scuba diving equipment, hand-held tire pressure gages, and inflatable tennis shoes may soon incorporate silicon micromachined sensors.

The demand for silicon sensors in ever expanding fields of use continues to fuel a need for new and different silicon microsensor geometries and configurations optimized for particular environments and applications. Unfortunately, a drawback of traditional bulk silicon micromachining techniques has been that the contours and geometries of the resulting silicon microstructures have been significantly limited by these fabrication methods. For instance, etching silicon structures with conventional etching techniques is constrained, in part, by the crystal orientations of silicon substrates, which limits the geometry and miniaturization efforts of many desired structures.

The increasing use of microsensors to measure pressure or acceleration has spurred the development of small silicon plate structures used, for example, as capacitors and to produce electrostatic forces. For instance, there exist microsensors that measure capacitance using an array of interdigitated polysilicon plates. Similarly, there exist microsensors that produce electrostatic forces using an array of interdigitated plates. Further, there exist microsensors that measure the flexure, or bending, of silicon structures in response to forces such as weight or acceleration.

In many applications it is desired to obtain both pressure and acceleration measurements. In such applications, fabricating both pressure and accelerometer sensors on a single chip would be advantageous. As pressure and accelerometer sensors are fabricated to smaller dimensions, it is desired to integrate both types of sensors on a single chip and at the same time optimize the material and structural characteristics as well as the methods of manufacturing. It is further desired to manufacture small accelerometer sensors with high sensitivity. Consequently, there has been a need for a single chip integrated accelerometer sensors and pressure sensors, and a method of fabricating accelerometer sensors and pressure sensors on a single chip.

The expanding fields of use of micromechanical devices in general, and of accelerometers and pressure sensors in particular, has created a demand for even smaller devices. Unfortunately, there has been difficulty producing smaller devices that are also highly sensitive to small changes in acceleration or pressure. For example, there has been a need for a smaller accelerometer that combines sufficiently thin flexure structures with a sufficiently large proof mass (or seismic mass) to be responsive to small changes in acceleration.

The present invention meets these needs.

SUMMARY OF THE INVENTION

In one aspect of the invention, a micromechanical device comprises a first semiconductor wafer that defines a recessed region. A semiconductor layer is secured to the wafer opposite the recessed region. A cantilever beam is formed in the semiconductor layer. The cantilever beam includes a flexure region secured to an anchor region of the semiconductor layer and includes a proof mass region suspended opposite the first recessed region. The flexure region is thin relative to the anchor region of the semiconductor layer.

In one embodiment, a vertical dimension of the flexure region is thin relative to a vertical dimension of the anchor region of the semiconductor layer so as to promote rotational movement of the proof mass out of the horizontal plane of the semiconductor layer about an axis through the flexure region in response to an acceleration force applied in a direction generally perpendicular to the horizontal plane of the semiconductor layer.

In another aspect of the invention, a method of sensing acceleration uses a cantilever beam suspended over a recessed region of a semiconductor wafer. An acceleration force is applied in a direction generally perpendicular to a horizontal plane of the semiconductor wafer. Flexure of the beam in a direction generally parallel to the direction of the acceleration force sensed.

In yet another aspect, a micromechanical device and method of producing the device are provided. In one embodiment, the device includes an accelerometer with a thinned cantilever structure. In another embodiment, the device includes an accelerometer and a pressure sensor integrated on a single chip.

The present invention is better understood upon consideration of the detailed description below in conjunction with the accompanying drawings and claims.

BRIEF DESCRIPTION OF THE DRAWINGS

FIGS. 3A through 3E are cross-sectional views of an exemplary process for manufacturing absolute pressure sensors using Silicon Fusion Bonding (SFB) and a Deep Reactive Ion Etch (DRIE)

DETAILED DESCRIPTION OF THE PREFERRED EMBODIMENTS

Figure 1A:
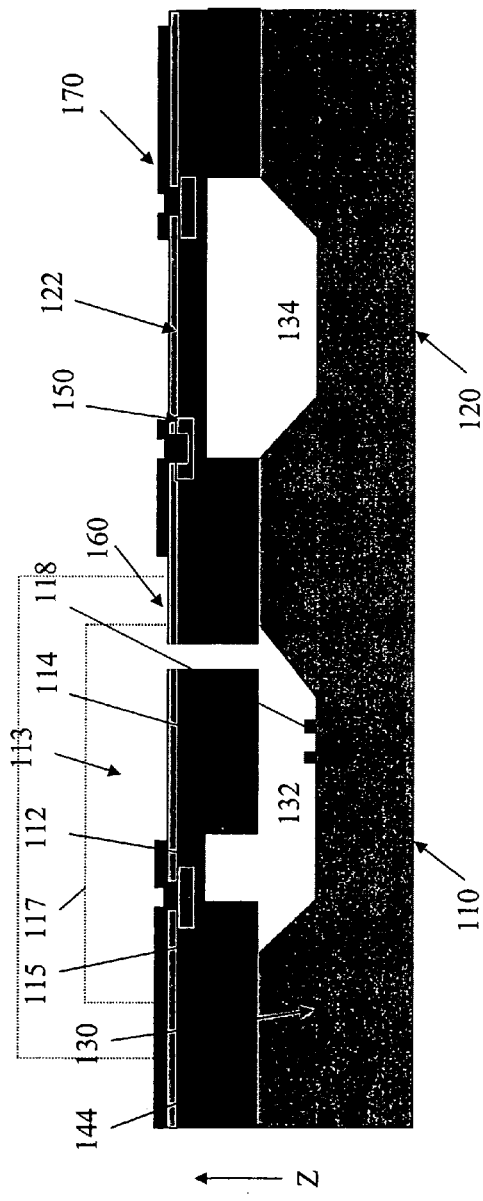
FIG. 1A is a cross-sectional view of an exemplary integrated accelerometer and pressure sensor on a single silicon chip.

The present invention provides a semiconductor micromechanical device with a thinned cantilever structure and associated methods of manufacture. The following description is presented to enable any person skilled in the art to make and use the invention. Descriptions of specific applications are provided only as examples. Various modifications to the preferred embodiment will be readily apparent to those skilled in the art, and the general principles defined herein may be applied to other embodiments and applications without departing from the spirit and scope of the invention. Thus, the present invention is not intended to be limited to the embodiments shown, but is to be accorded the widest scope consistent with the principles and features disclosed herein.

One exemplary device and manufacturing process in accordance with an embodiment of the invention provides an integrated piezoresistor accelerometer and pressure sensor using silicon fusion bonding and deep reactive ion etch. The exemplary device and process integrates piezoresistor accelerometers with a proof mass (sometimes referred to as a seismic mass) and absolute pressure sensors on a single chip.

Another exemplary device and manufacturing process in accordance with another embodiment of the invention provides an accelerometer manufactured with a thinned cantilever beam including a flexure region and relatively large proof mass. The exemplary accelerometer with a thinned beam offers improved sensitivity through use of a flexure with smaller structural dimensions.

The exemplary devices and manufacturing processes offer several advantages over existing processes. For instance, the overall chip size may be made smaller than conventional chips because the process does not require a potassium hydroxide (KOH) etch from the backside of the wafer, i.e., "backside etching." Further, the planar manufacturing processes are ideal for manufacturing purposes. Thinning the flexure beam in relation to the proof mass allow for increased sensitivity with small structure dimensions. Further, in an integrated accelerometer and pressure sensor chip process the beam flexure thickness can be sized independent of the diaphragm thickness while maintaining a planar top surface and efficient manufacturing processes.

The devices and manufacturing processes also allow for over-range protection and anti-stiction mechanisms to be easily included in the accelerometer portion of the structure. Additionally, only a single cap is needed for the chip, e.g., to cover the proof mass of the accelerometer, as compared to conventional chips that typically require a second cap for the pressure sensor. The exemplary single chip processes therefore allow for greater design flexibility and a smaller chip size with simplified manufacturing processes.

An integrated chip with an accelerometer and pressure sensor may be used in many applications. One exemplary application is remote tire pressure monitoring. A small chip with integrated accelerometers and pressure sensors is ideal for remotely indicating tire pressure in relation to a vehicle's speed or acceleration (linear speed and acceleration can be derived from the rotational acceleration experienced by the accelerometer). The single integrated chip can be packaged or coupled with an ASIC chip or the like to remotely retrieve and manipulate the piezoresistive sensor readings related to pressure and acceleration.

It should be recognized, however, that the integrated chip and associated methods of manufacture are useful in a wide variety of other applications not explicitly described herein to monitor acceleration or pressure.

An exemplary micromachined accelerometer sensor is made by forming a proof mass that extends away from a larger body of a silicon wafer and is attached thereto by a cantilever beam. In this embodiment, the beam acts as a flexure structure. Accelerometer sensors measure acceleration by sensing the movement of the proof mass relative to the wafer or substrate. In particular, as the proof mass moves relative to the wafer, properly placed piezoresistive sensor elements near or on the beam sense flexure in the beam caused by the movement of the proof mass indicated by a change in resistance of the piezoresistive sensor element.

Accelerometer sensitivity is achieved by thinning a flexure region of a cantilever beam in relation to the distally located larger proof mass. Accelerometers sensors may thus be made to smaller dimensions without unnecessary loss of sensitivity to small changes in acceleration. The flexure beam can be made thinner, for example, by forming a recess in a semiconductor layer prior to bonding to the substrate. Alternatively, multiple semiconductor layers can be layered over the substrate and etched to form recesses therein.

An exemplary micromachined absolute-pressure sensor can be made by forming a cavity within a silicon structure and a diaphragm adjacent to the cavity. For an absolute-pressure sensor the cavity is held in a vacuum. The absolute-pressure sensor measures pressure by sensing the flexure of the diaphragm, e.g., how the pressure acting on the front side of the diaphragm deflects the diaphragm inwards. One or more piezoresistive sensors formed near the edges of the diaphragm typically sense the flexure or deflection of the diaphragm.

Referring to FIG. 1A, a cross-sectional view of a micromechanical device including an integrated accelerometer sensor and pressure sensor in a single crystal silicon chip 100 is illustrated. The left side of chip 100 includes the accelerometer 1 10 region of the integrated chip 100 and the right side of chip 100 includes the pressure sensor 120 region of the integrated chip 100. Accelerometer sensor 110 and pressure sensor 120 are formed over recesses 132 and 134 in a silicon wafer 130, for example, an N-type substrate. Positioned over silicon wafer 130 is an N-type silicon layer 144. Layer 144 may include one or more actual epitaxial layers as will be described below. P-type piezoresistive sensor elements 150 are strategically implanted within layer 144 to sense flexure in the silicon structures. Chip 100 also includes an oxide/nitride layer 160 and metal interconnects 170 formed on the layer 144 to couple the piezoresistive sensor elements 150 to an exterior of the chip. Silicon wafer 130 may further be formed on a carrier wafer or substrate (not shown).

It should be recognized that the P-type and N-type materials described herein can be used in an alternative fashion, e.g., by replacing P-type materials for N-type materials and vice versa.

Figure 1B:
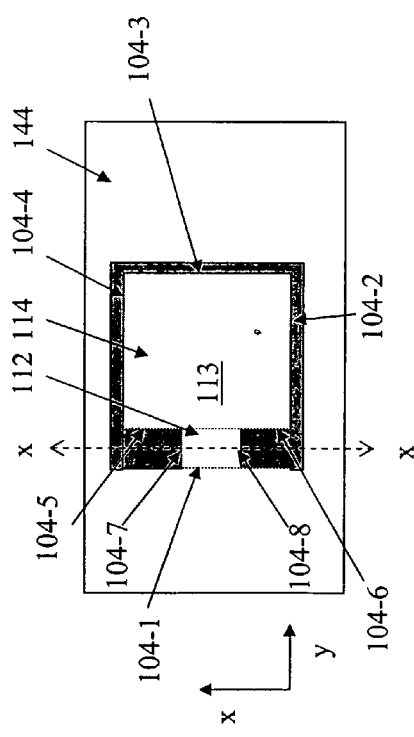
FIG. 1B is a top view of an exemplary accelerometer sensor.

With reference to FIGS. 1A and 1B, an exemplary accelerometer sensor and operation thereof is described. FIG. 1B illustrates a top view of the suspended structure of the accelerometer sensor of FIG. 1A disposed above recess 132, however, for illustrative purposes metal interconnections 170, oxide layer 160, and piezoresistive elements 150 of FIG. 1A are not shown. A beam 113 is suspended over recess 132. The beam 113 includes a flexure region 112 and a proof mass region 114. The beam 113 includes a generally horizontal boundary region 104-1 to 104-8, which surrounds the flexure region 112 and the proof mass region 114. A thinned flexure region 112 of the beam 113 is secured to thicker portions of the layer 144 along one boundary region portion 104-1 of the beam 113. The other boundary portions 104-2 to 104-8 of the beam 113 are released from layer 144 so that the beam 113 is suspended opposite the recess 132 and so that the beam 113 can flex most freely in a direction generally perpendicular to horizontal dimensions of layer 144.

More specifically, trenches are etched vertically completely through the layer 144 along boundary regions 104-2 to 104-8 so as to define a cantilever beam 113. Boundary region 104-1, which is not etched completely through, is thinned so as to produce a flexure region 112. The flexure region 112 comprises a proximal end of the beam 113 that is secured to an anchor region 115 of layer 144. The flexure region 112 is thin relative to an adjacent anchor region 115 of the layer 144 to which the flexure region 112 is secured. In the embodiment of FIGS. 1A-1B, the anchor region 115 is suspended over the recess 132. It will be appreciated, however, that the anchor region 115 need not be suspended, as best shown in the alternative embodiment described with reference to FIG. 2F. The flexure region 112 also is thin relative to the proof mass region 114, which comprises a distal portion of the beam 113. The thinness of the flexure region 112 relative to the anchor region 115 to which it is secured, promotes movement of the cantilever beam 113 in a direction generally parallel to a vertical dimension of the layer 144. The vertical dimension of the layer 144 is indicated by an arrow labeled z in the drawings. The vertical dimension is generally perpendicular to a horizontal plane of the layer 144.

In particular, the thinness of the flexure 112 relative to the anchor region 115 to which it is secured facilitates flexure of the flexure region 112 resulting in generally rotational movement of the proof mass region 114 out of the plane of the layer 144 about a horizontal axis x-x that runs through the flexure region 112. For example, as the flexure region 112 flexes in response to an acceleration force, the proof mass 114 may move, at least temporarily, to a position that is slightly above or slightly below a horizontal surface of the semiconductor layer 144. The horizontal dimensions of layer 144 are indicated by axes labeled x and y in the drawings. The horizontal dimensions are parallel to the horizontal plane of layer 144. The relative thickness of the proof mass region 114 further promotes such movement when, for example, an acceleration force is applied in a direction generally perpendicular to the horizontal dimension of the layer 144.

Accelerometer sensor 110 thus operates by measuring the flexure in the beam 112 caused by motion of the proof mass 114 that is positioned over recess 132 and depends from layer 144 through beam 112. The flex or bend of beam 112 is sensed by one or more piezoresistive sensor elements 150 located near an anchor region 115, or base of beam 112, i.e., near the point where beam 112 depends from layer 144. The change in resistance of piezoresistive sensor elements 150 can be determined via metallization elements 170 to determine the amount of flexure and thus the acceleration experienced by the sensor.

Further, a cap 117 (shown in phantom lines) may be formed over the accelerometer portion of the chip 100 to protect the structures from environmental effects or contain a dampening fluid or gas around the proof mass 114. Additionally, dimples 118 may be included on the bottom of recess 132 or the underside of cap 117 as over-range protection and anti-stiction structures, i.e., to prevent damage to the structure from large accelerations. For example, the cap 117 and dimples 118 may protect the silicon structure for shock forces up to 10,000 G (1 G=9.81 m/s$^2$)

Pressure sensor 120 operates by measuring flexure in the thinned structure or diaphragm 122 formed in layer 144 over the cavity between wafer layer 130 and layer 144. The diaphragm serves as a flexure structure in the pressure sensor. As the pressure outside of the cavity changes the diaphragm 122 will flex towards or away from cavity 134. In one example, pressure sensor 120 is formed with a vacuum within the cavity thereby forming an absolute-pressure sensor. Diaphragm 122 will flex inwards towards the cavity in a predictable way from pressure exerted on the diaphragm. The flexure in diaphragm 122 is detected by one or more piezoresistive sensor elements 150 formed in layer 144 on or near the edges of diaphragm 122. The resistance of piezoresistive elements 150 can be determined via a circuit, such as a wheatstone bridge circuit and the like, interconnected using metallization elements 170. The resistance of the piezoresistive elements 150 varies with flexure of the diaphragm 122. Thus, measurement of the piezoresistive resistance can be used to determine the amount of flexure and thus determine the pressure exerted on the sensor.

Details of the circuitry and methods used to determine the amount of flexure of beam 112 or diaphragm 122 from the piezoresistive sense elements 150, and thus the amount of acceleration or pressure respectively, employ techniques well-known to those skilled in the art and are not part of the present invention. For example, measuring changes in resistance, amplifying signals, and compensating for dependence on temperature with external circuits are well known. Hence, they need not be described in great details.

Figure 2A:
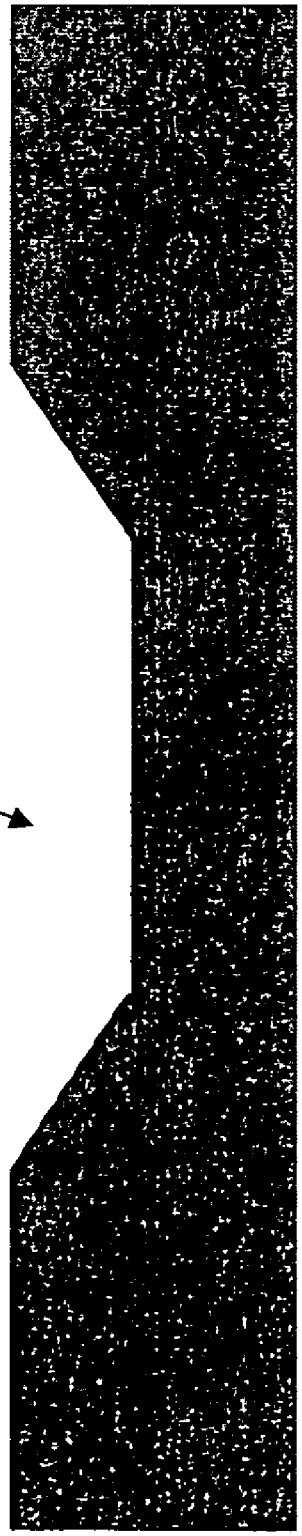
FIGS. 2A through 2F are cross-sectional views of an exemplary process for manufacturing accelerometer sensors using Silicon Fusion Bonding (SFB) and a Deep Reactive Ion Etch (DRIE)

An exemplary process for fabricating a silicon accelerometer sensor like the one illustrated in FIG. 1A is explained with reference to the illustrations depicted in FIGS. 2A-2F. FIG. 2A illustrates a single crystal silicon substrate, or wafer 130 with N doping and a recessed region 132 formed therein. Recess region 132 is formed in the silicon wafer 130 using standard semiconductor techniques such as plasma etching, wet-etching with KOH or other silicon etchants, differential oxide growth, or the like. Additionally, a high anisotropy etch can be employed, such as the "multiplex RIE system," that performs an inductively coupled plasma DRIE and is available from Surface Technology Systems (STS), which has a place of business in Palo Alto, Calif. A high anisotropy etch allows for a higher aspect ratio recessed region 132.

Recessed region 132 can have any arbitrary geometry and can have any required depth, from less than 0.1 micron to greater than 100 microns, for example, depending on the particular application. Further, dimples 118 (FIG. 1A) can be formed in the bottom portion of recess 132 to avoid stiction when the proof mass 114 is displaced beyond its range.

It should be further noted that recessed region 132 need not have a single, uniform depth. Further, the base of the recessed region can be either bare silicon, oxidized silicon, doped silicon, or it can be coated with any other thin film capable of withstanding subsequent wafer bonding and processing temperatures.

Figure 2B:
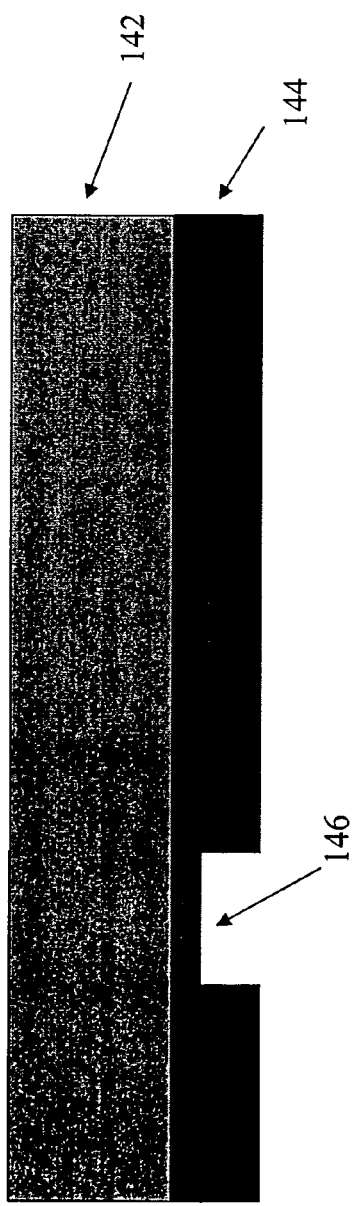

FIG. 2B illustrates a second silicon wafer 142, a P-type substrate silicon wafer with an N-type layer 144 formed thereon. A cavity or recess 146 is then etched from layer 144. Recess 146 can be etched by standard semiconductor techniques such as a silicon reactive ion etch (RIE), DRIE, KOH, wet etch, or the like. The etch is timed such that layer 144 is not fully etched through to the P-type substrate 142. Rather, a vertical thickness in layer 144 is left that corresponds to the desired thickness of beam 112 of the formed accelerometer sensor.

Figure 2C:
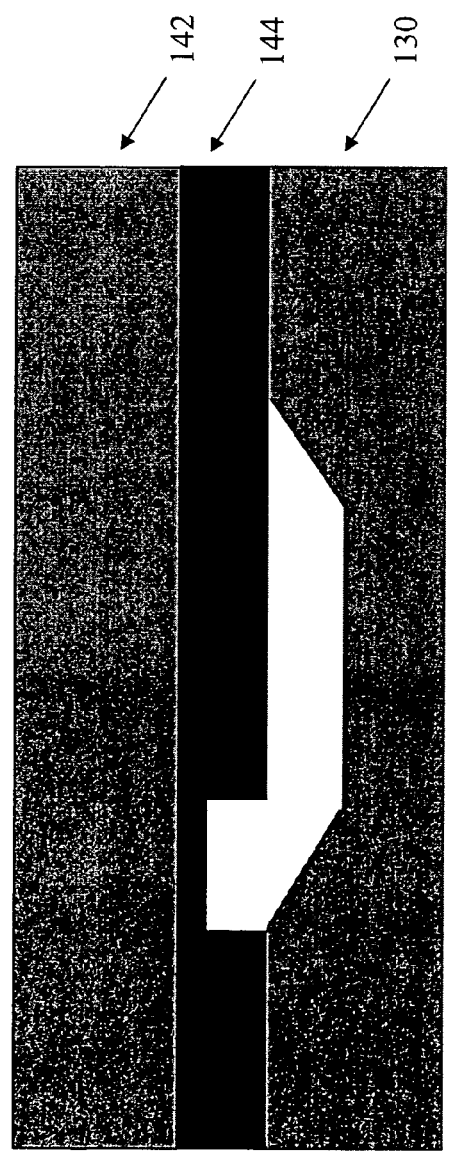

With reference to FIG. 2C, the first wafer 130 and second wafer 142 are appropriately aligned and secured together with the layer 144 therebetween. In a present embodiment, recess 146 of the layer 144 is aligned near and over one edge of recess 132 formed in the first wafer 130 and secured thereto by a silicon fusion bonding (or direct bonding) process. Fusion bonding techniques are well known. For example, refer to, K. E. Petersen, D. Gee, F. Pourahmadi, R. Craddock, J. Brown, and L. Christel, "Surface Micromachined Structures Fabricated with Silicon Fusion Bonding," Proceedings, Transducers 91, June 1991, at pp. 397-399 which is expressly incorporated herein by reference. In one exemplary fusion bonding technique, the opposing surfaces are made hydrophilic. That is, they are treated with an agent such as hot nitric acid or a hot sulfuric acid and hydrogen peroxide solution or another strong oxidant that causes water to adhere to them. The two wafers then are placed in an oxidizing atmosphere at a temperature of 400°C.-1200°C. for approximately one hour.

The silicon fusion bonding technique described above bonds the first wafer 130 and the layer 144 together without the use of an intermediate glue material that could have a different coefficient of thermal expansion than the single crystal silicon wafer. Furthermore, fusion bonding can be performed in which oxide or nitride layers have been formed in the bonded surfaces of one or both of the wafers.

Figure 2D:
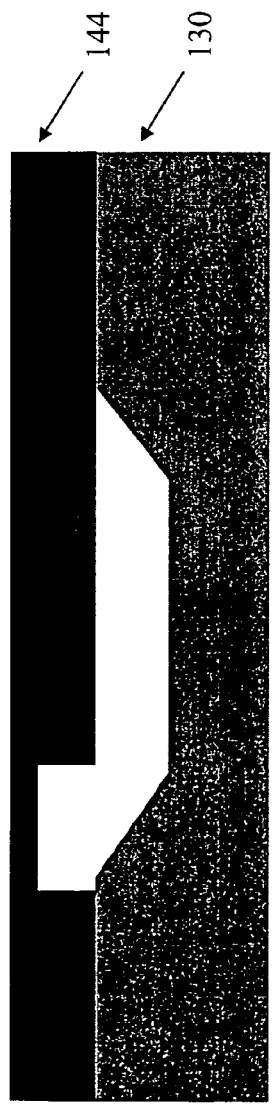

With reference now to FIG. 2D, after the opposing surfaces of the wafer 130 and layer 144 have been bonded, the second wafer 142 is removed leaving layer 144 on wafer 130. The second wafer 142 is removed, for example, by an electrochemical KOH etch in which the layer 144 serves as an etch stop layer.

Figure 2E:
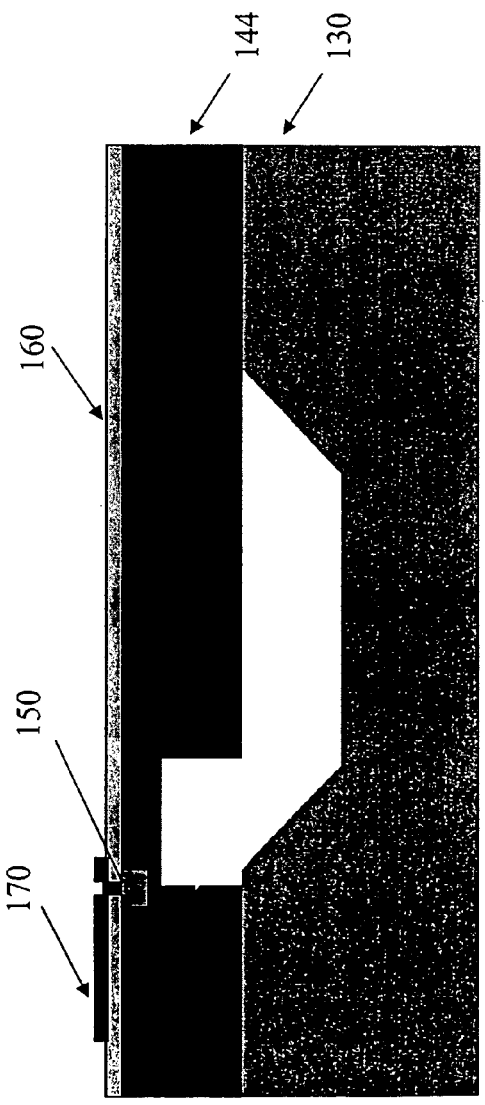

With reference to FIG. 2E, one or more P-type piezoresistive sensor elements 150 are implanted near the base of beam 112 in layer 144. For example, Boron implantation and diffusion at 1100°C. may form piezoresistive sensor elements 150. Further, an insulating oxide/nitride layer 160 is formed over the layer 144 followed by the metallization of metal interconnects 170 coupled to the piezoresistive sensor elements 150.

Figure 2F:
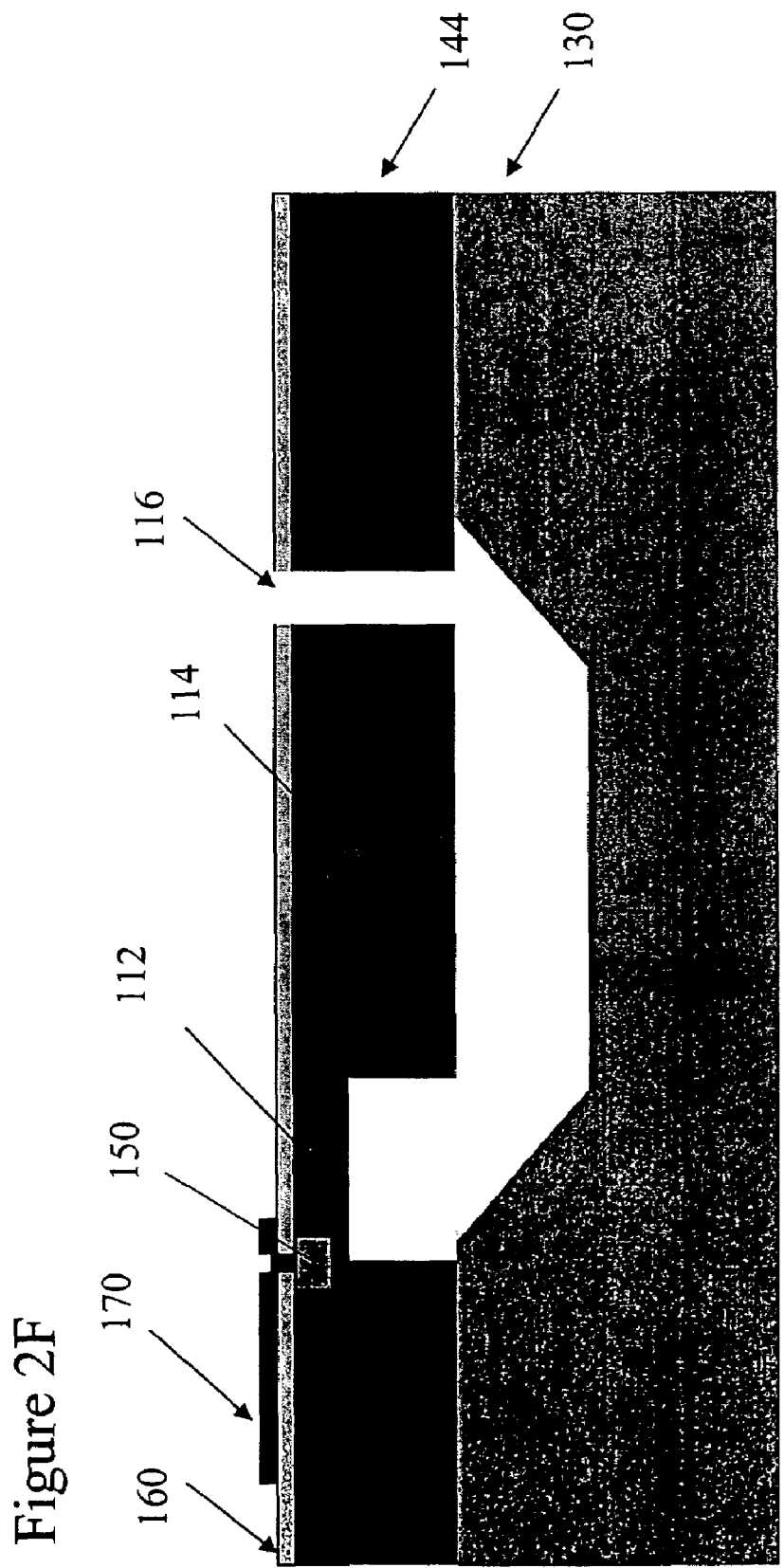

With reference to FIG. 2F, a deep reactive ion etch (DRIE) is performed to "release" beam 112 and proof mass 114, i.e., beam 112 and proof mass 114 are detached from layer 144, except the base of beam structure 112 such that proof mass 114 may move. The top surface of the layer 144 is first patterned with a relief pattern for the DRIE to form via 116 and release the accelerometer structure proof mass 114. An exemplary deep reactive ion etch is described, for example, in U.S. Pat. No. 6,316,796, entitled, "SINGLE CRYSTAL SILICON SENSOR WITH HIGH ASPECT RATIO AND CURVILINEAR STRUCTURES," and is incorporated herein by reference in its entirety.

DRIE, in essence, involves a synergistic action between chemical etch and ion bombardment. Impinging energized ions chemically react with the silicon surface. The DRIE process advantageously etches in the vertical direction at a much higher rate than in the lateral direction, e.g., anisotropically, regardless of silicon crystal planes or crystal orientation. As a result, relatively deep substantially vertical trenches or slots can be formed in layer 144. These substantially vertical trenches or slots can be formed anywhere in layer 144 regardless of crystallographic orientation within the silicon material. Consequently, high aspect ratio vias can be formed to release beam 112 and proof mass 114 while allowing for a small overall chip size.

The DRIE etching step defines and mechanically "releases" proof mass 114 from layer 144 thereby allowing beam 112 and proof mass 114 to move relative to wafer 130 and layer 144. For example, proof mass 114 may move up or down out of the plane of the layer 144 in response to an acceleration of the accelerometer sensor. The movement of proof mass 114 causes flexure in the beam 112 that is sensed by one or more piezoresistive sensor elements 150.

Additionally, the accelerometer sensor can be encapsulated using a cap 117, for example, to isolate the structures from environmental effects such as humidity, or to isolate the beam 112 and proof mass 114 within a vacuum or dampening fluid or gas. Additionally, dimples 118 (FIG. 1A) may be included on the bottom of the recess or the underside of a cap to prevent stiction when an over range displacement occurs.

Thus, a small highly sensitive accelerometer can be produced. Thickness, and therefore massiveness of the proof mass portion of beam 112 can be determined by the thickness of layer 144. Thinness of the flexure portion of beam 112 can be determined by the etch process described with reference to FIG. 2B. Moreover, during the etch process of FIG. 2B, the second silicon wafer 142 serves as a convenient carrier (or handle) for the layer 144 that is being etched. Thus, a smaller suspended beam structure can be produced in which flexure region thinness and seismic mass thickness are selected to achieve desired sensitivity to changes in acceleration.

With reference to FIGS. 3A-3E, an exemplary method of manufacturing a pressure sensor such as the one illustrated in FIG. 1A is illustrated. It will be understood that many details of the processes described with reference to FIGS. 2A-2F are used during the fabrication steps described with respect to FIGS. 3A-3E. Accordingly, these process details will not be reiterated with reference to FIGS. 3A-3E. Further, the method in FIGS. 3A-3E is similar in certain aspects to the method illustrated in FIGS. 2A-2F for forming the accelerometer sensor and can be advantageously integrated into a single chip in parallel or in series. The integrated sensors in a single chip can be used, for example, in a remote tire pressure and acceleration monitoring system or the like.

Figure 3A:
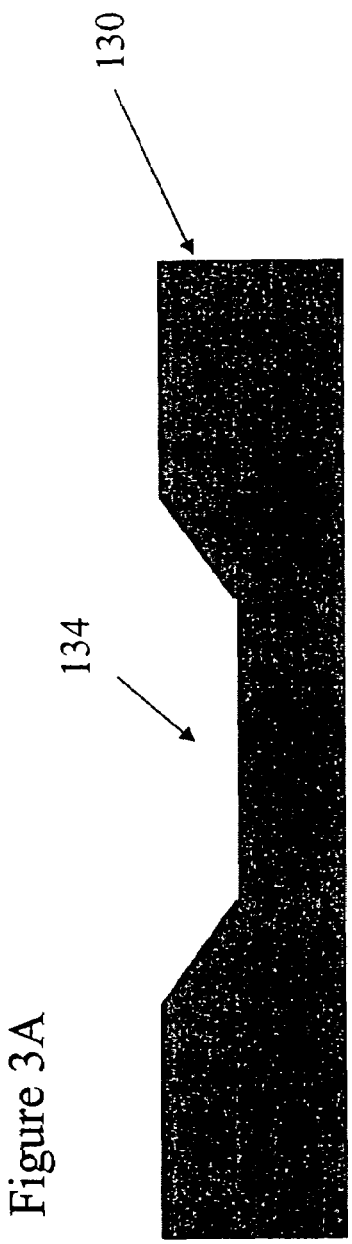

FIG. 3A illustrates a first wafer 130, an N type substrate, with a recessed region 134 formed therein. The recessed area 134 is formed by standard semiconductor manufacturing processes, such as a KOH etch or the like. Recessed area can be any arbitrary geometry and will serve as part of the inner cavity of the formed pressure sensor.

Figure 3B:
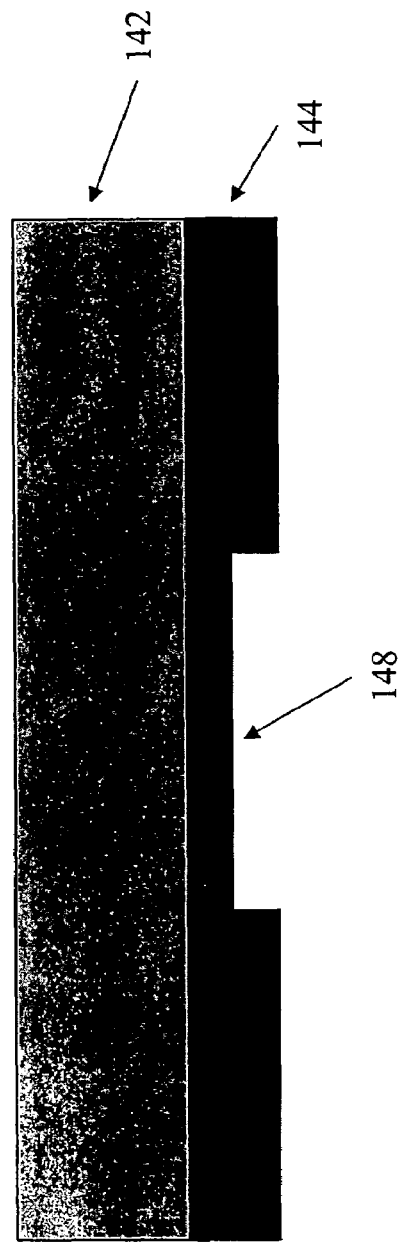

FIG. 3B illustrates a second silicon wafer 142, a P-type substrate wafer, with an N-type layer 144 formed thereon. A recessed region 148 is etched from layer 144 via a RIE, DRIE, wet etch, or the like. Layer 144 is patterned and a timed etch is performed to etch partially into layer 144 leaving a desired thickness of layer 144. The recessed portion of layer 144 will correspond to a thin diaphragm 122 of the formed pressure sensor.

With reference to FIG. 3C, the first wafer 130 and second wafer 142 are appropriately aligned with recess 134 facing recess 148. The first wafer 130 and second wafer 142 are secured to each other. In particular, recess 148 of layer 144 is aligned over the cavity 134 formed in first wafer 130. In a present embodiment, first wafer 130 and second wafer 142 are secured through silicon fusion bonding. P-type substrate of second wafer 142 is then removed, for example, by an electrochemical KOH etch or the like leaving layer 144 on the first wafer 130 as seen in FIG. 3D.

Figure 3E:
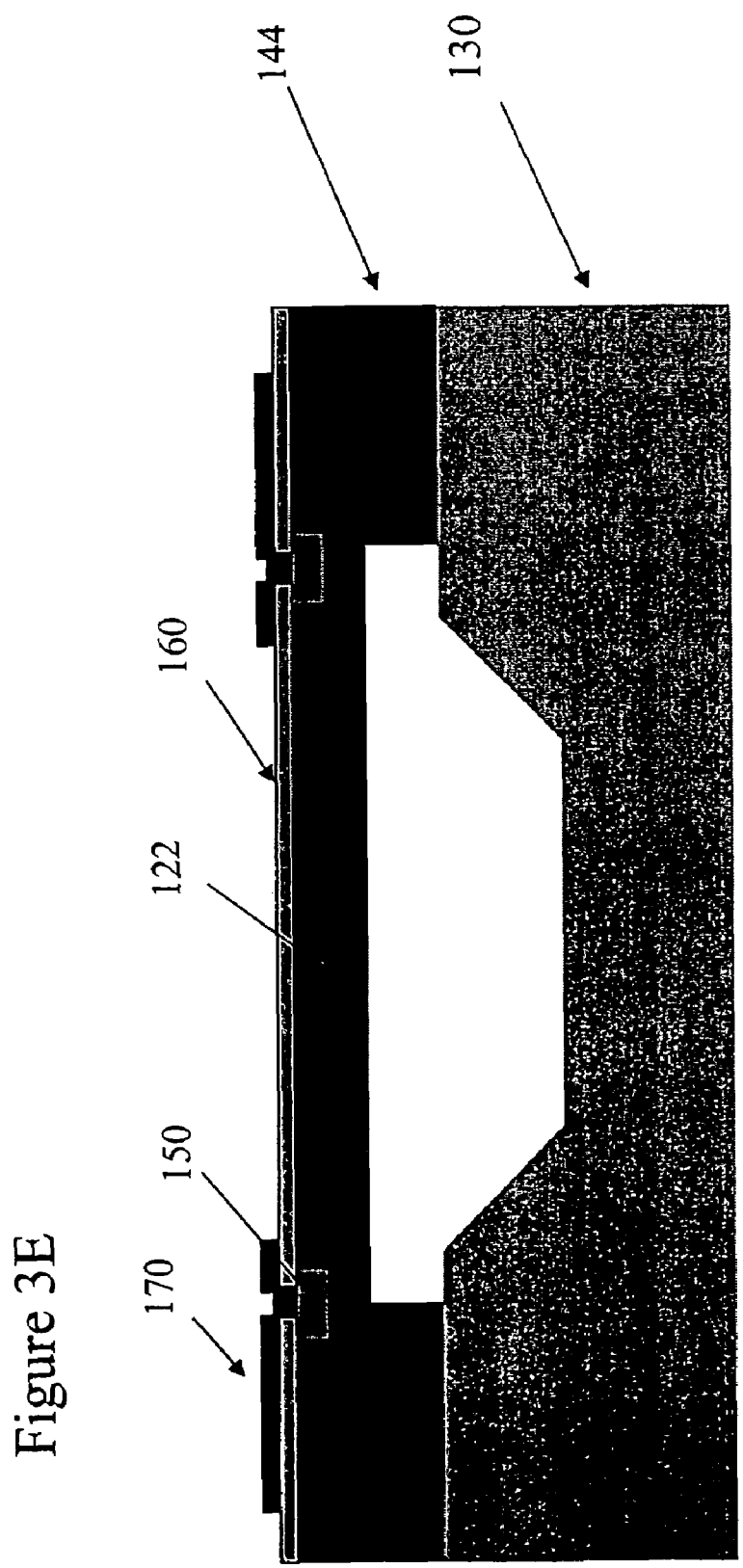

With reference to FIG. 3E, one or more P-type piezoresistive sensor elements 150 are implanted near the edges of thin diaphragm 122 formed as part of layer 144. Piezoresistive sensor elements 150 are positioned to sense flexure in diaphragm 122. It should be noted that any number of piezoresistive sensor elements 150 may be employed and their exact positioning relative to the diaphragm 122 may be different depending on the particular application, expected pressures, sensitivity requirements, and the like. Further, an oxide/nitride layer 160 is deposited over layer 144 followed by the metallization of the metal interconnects 170.

The methods illustrated in FIGS. 2A through 2F and FIGS. 3A through 3E can be performed in parallel or in series to form integrated accelerometer sensors and pressure sensors on a single chip. Performing the process in parallel offers the advantages of greater processing throughput, i.e., fewer total processing steps for the combined chip. Also, the parallel process allows for beam 112 thickness to be independent of the thickness of diaphragm 122. For instance, by etching the recess 146 and 148 in layer 144 to different depths for beam 112 and diaphragm 122 the thickness and sensitivity of each sensor can be individually optimized.

FIGS. 4A-4H illustrate another exemplary method for fabricating an accelerometer sensor and pressure sensor in parallel on a single silicon crystal chip. In this exemplary method, beam 112', proof mass 114', and diaphragm 122' are built up with multiple semiconductor layers, or sublayers to form desired structures. Again, it will be understood that many details for the processes described with reference to FIGS. 2A-2F are used during the fabrication steps described with respect to FIGS. 4A-4H. Accordingly, these process details will not be reiterated with reference to FIGS. 4A-4H.

Figure 4A:
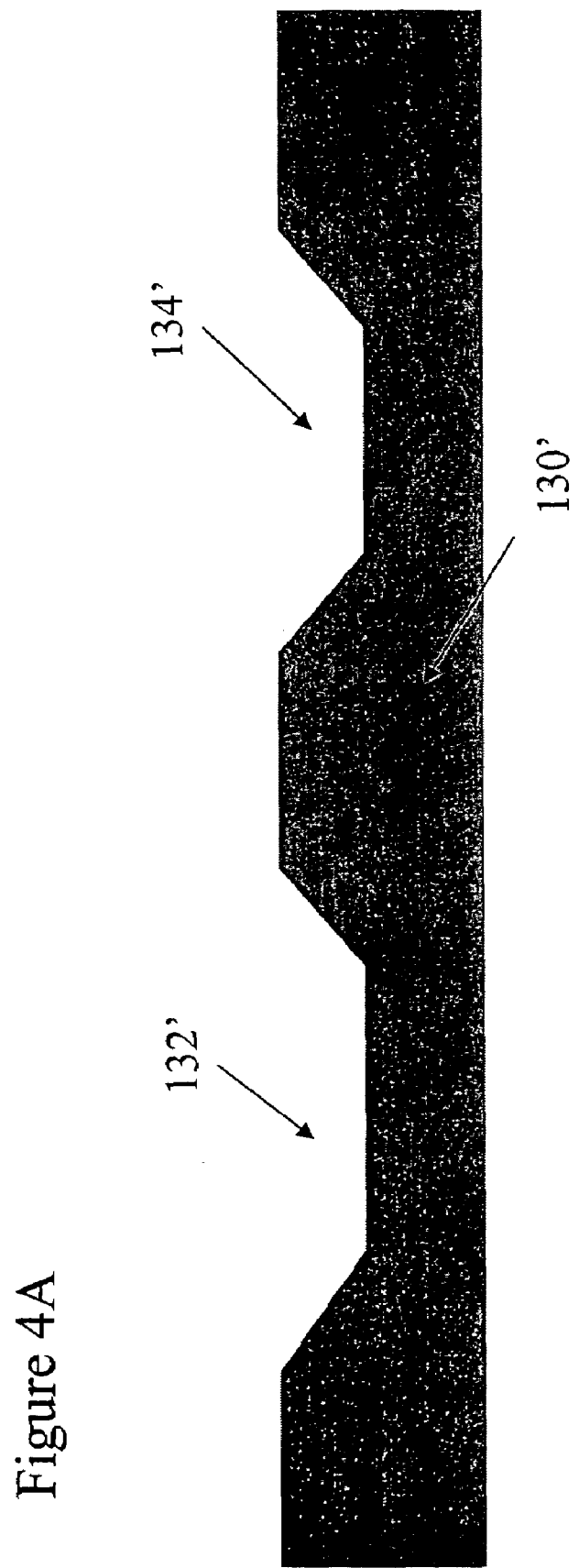
FIGS. 4A through 4H are cross-sectional views of an alternative exemplary process for manufacturing both accelerometer sensors and pressure sensors using Silicon Fusion Bonding (SFB) and a Deep Reactive Ion Etch (DRIE).

With reference to FIG. 4A, a first N-type substrate, wafer 130' is patterned and etched to form recessed area 132' and recessed area 134', corresponding to recessed areas for the accelerometer sensor and the pressure sensor respectively.

Figure 4B:
Figure 4C:
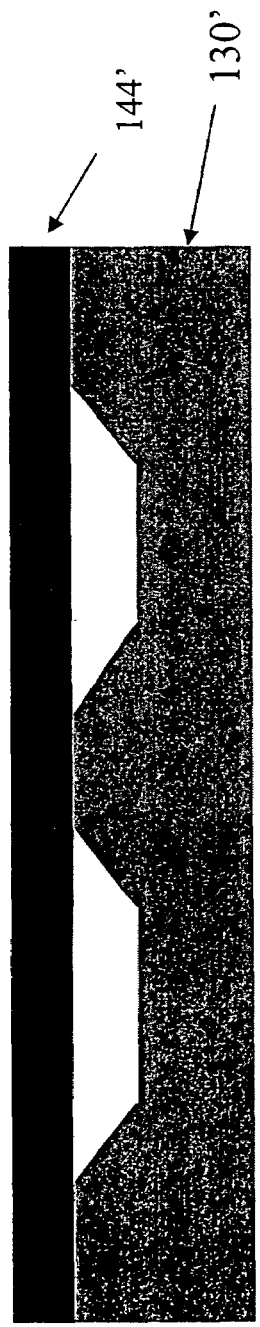

With reference to FIG. 4B, a second P-type substrate, wafer 142' with an N-type layer 144' is placed over and silicon fusion bonded to the first silicon wafer 130'. In this exemplary process, which differs from the process described above, the layer 144' is not thinned, i.e., etched, prior to the silicon fusion bonding. The second wafer 142' is electrochemically etched back using KOH or the like to layer 144' in FIG. 4C. Layer 144' is left bonded to the first wafer 130' and covers recess 132' and recess 134'.

Figure 4D:
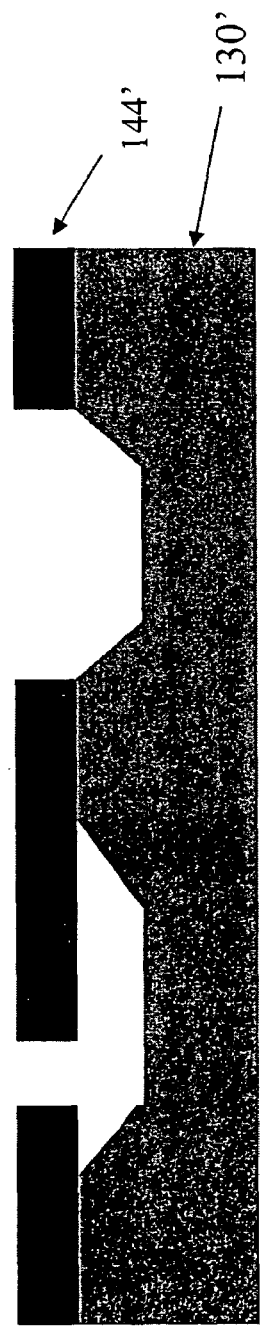
Figure 4E:
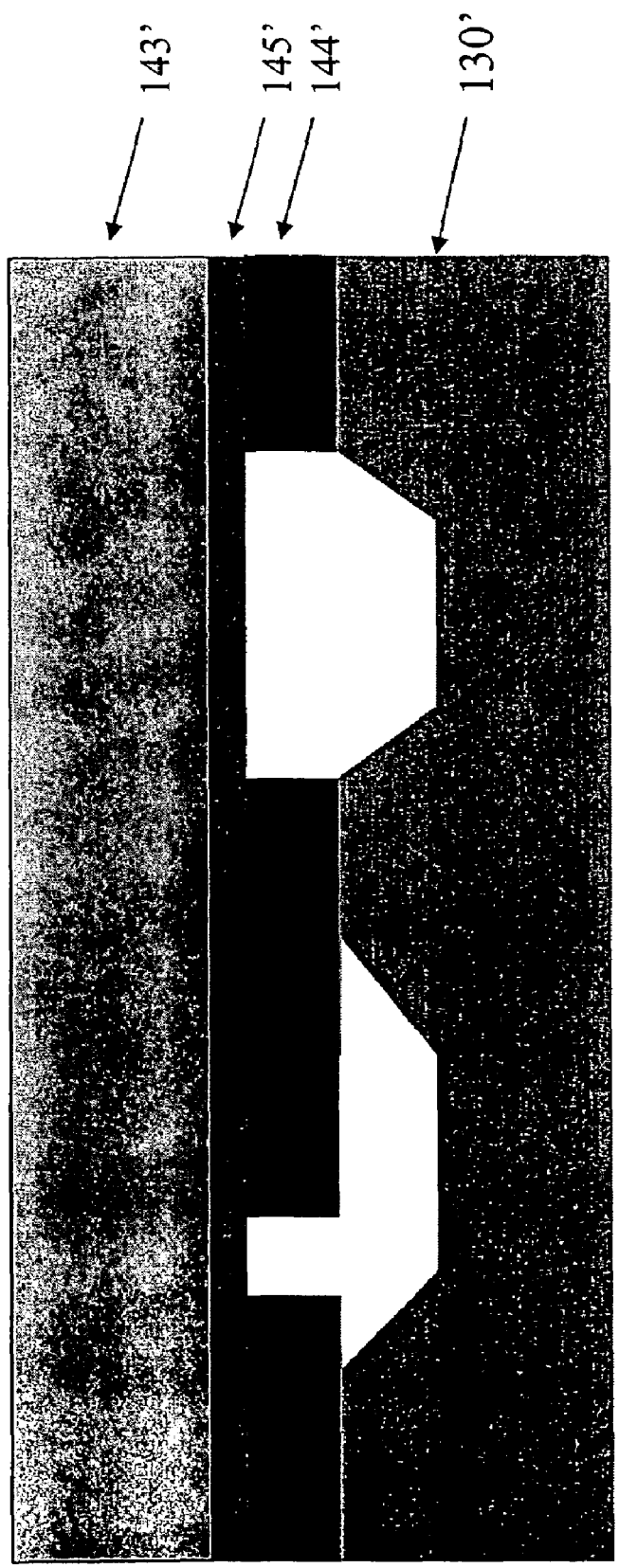

With reference to FIG. 4D, the top or exposed surface of the layer 144' is then patterned and etched with a DRIE. Layer 144' is patterned such that the DRIE forms an opening in layer 144' and above recessed region 132'. This opening will correspond to the thinned region of beam 112'. As will be described below with reference to FIG. 4E, a second semiconductor layer 145' will be placed over layer 144' and will serve, in part, as beam 112'.

Layer 144' is further patterned such that the DRIE forms an opening in layer 144' above recessed region 134'. This opening corresponds to the sidewalls of the cavity of the pressure sensor with second layer 145' layered over layer 144' to form the diaphragm 122'.

Figure 4F:
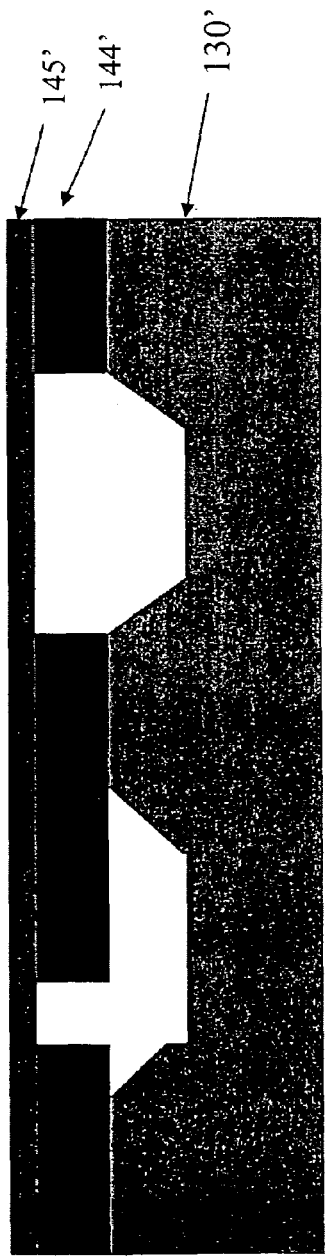
Figure 4G:
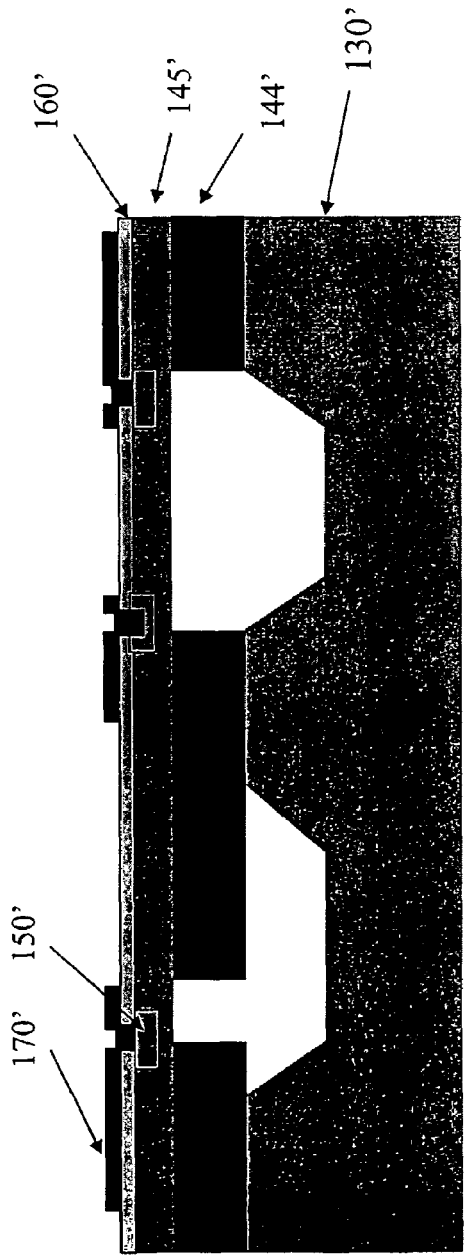

With reference to FIG. 4F, a third P-type substrate, wafer 143' with an N-type epitaxial layer 145' is placed over layer 144' and silicon fusion bonded together as described above. Similarly, the silicon wafer 143' is electrochemically etched away with a KOH etch or the like with the epitaxial layer 145' serving as an etch stop. Epitaxial layer 145' is, for example, the same material as epitaxial layer 144'. Alternatively, epitaxial layer 144' and 145' may include different materials With reference to FIG. 4G, multiple P-type piezoresistive sensor elements 150' are then implanted in second layer 145'. One piezoresistive sensor element 150' is implanted near the base of the thin region or beam 112', i.e., the region of layer 145' above the via etched in layer 144', to sense flexure in beam 112'. Additional piezoresistive sensor elements 150' are implanted in the second layer 145' near the edges of the thin diaphragm of the pressure sensor to sense flexure in the diaphragm. Further an oxide/nitride layer 170' is deposited over the layer 145' followed by the metallization of metal interconnects 170'.

Figure 4H:
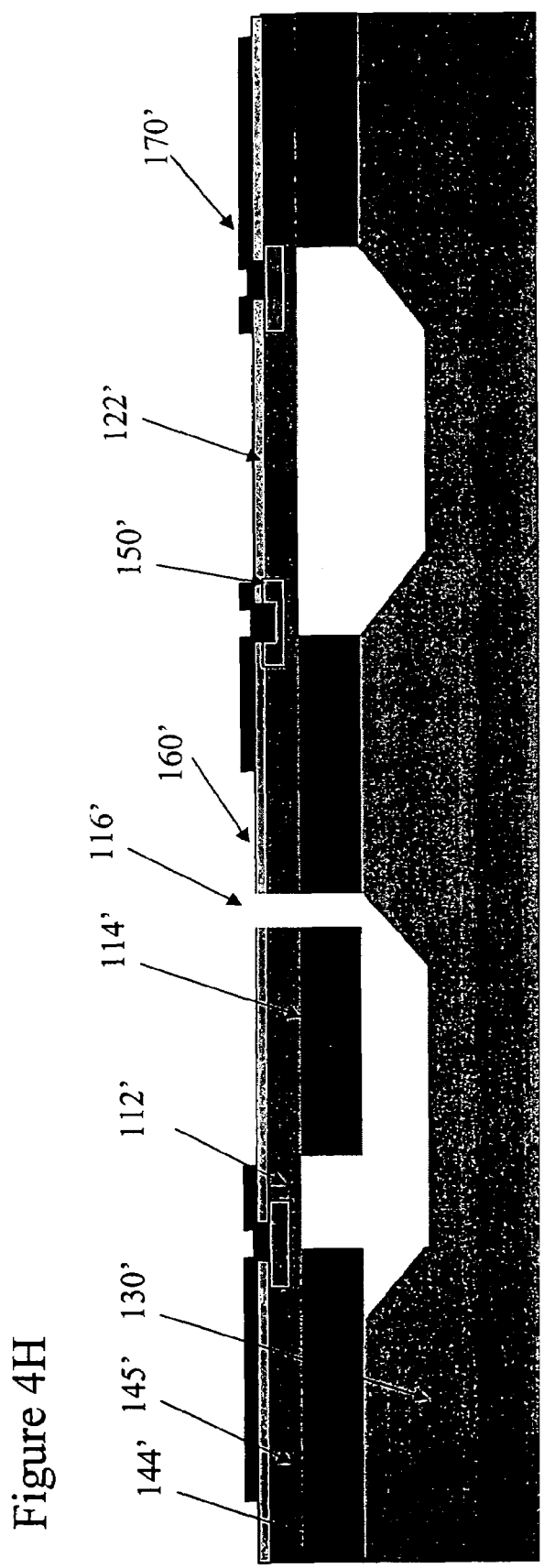

Additionally, with reference to FIG. 4H, a second DRIE is performed to release the accelerometer structure, i.e., the proof mass 114' from the layer 144' and 145'. The top surface of the second layer 145' is patterned and a DRIE performed to etch a relief pattern or via 116' to release beam 112' and proof mass 114'. Proof mass 114' consists of both the first and second layers 144' and 145' and is attached to the remainder of the chip structure through beam structure 112' which includes a portion of second layer 145'.

Additionally, as described above, the accelerometer can be encapsulated with a cap (not shown) to protect the structures of the accelerometer sensor or to contain a vacuum, fluid, or gas around proof mass 114'. Also, the cavity formed within the pressure sensor can be manufactured at a vacuum to measure absolute pressures.

The above detailed description is provided to illustrate exemplary embodiments and is not intended to be limiting. It will be apparent to those skilled in the art that numerous modification and variations within the scope of the present invention are possible. For example, the accelerometer and pressure sensor can be manufactured on a single chip in series or in parallel with any of the exemplary methods described. Further, numerous other materials and processes can be used within the scope of the exemplary methods and structures described as will be recognized by those skilled in the art. Accordingly, the present invention is defined by the appended claims and should not be limited by the description herein.

The invention claimed is:

1. A process of fabricating a micromechanical device comprising:

providing a first semiconductor wafer having generally planar horizontal dimensions;

forming a recess region in the semiconductor wafer;

securing a semiconductor layer to a surface of the wafer opposite the recess region, wherein the semiconductor layer includes a vertical dimension generally perpendicular to the generally planar horizontal dimensions of the first semiconductor wafer and includes a horizontal dimension generally parallel to the generally planar horizontal dimension of the first semiconductor wafer, and wherein the act of securing includes:

providing a second wafer with the semiconductor layer formed thereon, forming a recess in the semiconductor layer, securing the semiconductor layer to the first surface of the wafer, and removing the second wafer;

forming a suspended structure in the semiconductor layer disposed opposite the recess region, wherein the suspended structure includes a vertical dimension generally parallel to a vertical dimension of the semiconductor layer and includes a horizontal dimension generally parallel to a horizontal dimension of the semiconductor layer;

wherein the suspended structure includes a boundary region that is released from other portions of the semiconductor layer except in a flexure region of the boundary region;

wherein the suspended structure includes a seismic mass region within the boundary region;

wherein the flexure region of the boundary region and released portion of the boundary region are disposed to permit generally rotational movement of the seismic mass about an axis through the flexure region and in a direction generally parallel to the vertical dimension of the semiconductor layer; and wherein a vertical dimension of the flexure region is thin relative to a vertical dimension of the seismic mass region so as to promote such rotational movement in response to an acceleration force applied in a direction generally perpendicular to the horizontal dimension of the semiconductor layer.

2. The process according to claim 1, wherein the act of securing includes silicon fusion bonding.

3. The process according to claim 1, wherein the act of forming the suspending structure includes etching substantially vertically through the semiconductor layer with a deep reactive ion etch.

4. The process according to claim 1, further comprising implanting at least one piezoresistive sensor element to sense flexure in the flexure region.

5. The process according to claim 1, wherein the act of securing a semiconductor layer includes securing a first sublayer and securing a second sublayer;

wherein the second sublayer defines the flexure region of the suspended structure; and wherein the first sublayer and the second sublayer together define the seismic mass region of the suspended structure.

6. The process according to claim 1, wherein removing the second wafer includes etching the second wafer.

7. The process according to claim 1 wherein removing the second wafer includes an electrochemical KOH etch.

8. The process according to claim 1, further including forming the suspended structure in the semiconductor layer with a KOH etch.

9. The process according to claim 1, further including forming the suspended structure in the semiconductor layer with a deep reactive ion etch.

10. The process according to claim 1, further including:

forming a second recess region in the wafer;

forming a thinned region in the semiconductor layer, and disposing the thinned region opposite the second recess region to allow flexure in a direction generally parallel to the vertical dimension of the semiconductor layer.

11. The process according to claim 10, wherein the semiconductor layer includes a first sublayer and a second sublayer;

wherein the first sublayer defines the flexure region of the suspended structure.

* * * * *